United States Patent

[11] 3,619,672

[72] Inventors Takashi Nagata
Ikeda;
Michio Ishibashi, Suita; Yasuo Nakajima, Osaka, all of Japan
[21] Appl. No. 71,367
[22] Filed Sept. 11, 1970
[45] Patented Nov. 9, 1971
[73] Assignee Matsushita Electric Industrial Co., Ltd. Kadoma, Osaka, Japan
Continuation of application Ser. No. 711,292, Mar. 21, 1968, now abandoned.

[54] PIEZOELECTRIC CERAMIC RESONATOR AND MOUNTING
5 Claims, 6 Drawing Figs.

[52] U.S. Cl. .................... 310/9.4, 310/9.7
[51] Int. Cl. .................... H01v 7/00
[50] Field of Search .................... 310/9.0, 9.1, 9.2, 9.3, 9.4, 9.7, 9.8, 8.3, 8.2

[56] References Cited
UNITED STATES PATENTS

| | | | |
|---|---|---|---|
| 2,438,708 | 3/1948 | Kuenstler | 310/9.2 |
| 2,488,781 | 11/1949 | Reeves | 310/9.2 X |
| 3,167,668 | 1/1965 | Nesh | 310/9.1 X |
| 3,299,301 | 1/1967 | Heilmann et al. | 310/9.1 |
| 2,430,478 | 11/1947 | Nelson | 310/9.2 X |
| 2,386,692 | 10/1945 | Kuenstler | 310/9.4 X |
| 2,326,923 | 8/1943 | Bokoroy | 310/9.4 |

*Primary Examiner*—D. F. Duggan
*Assistant Examiner*—B. A. Reynolds
*Attorney*—Wenderoth, Lind & Ponack

ABSTRACT: A ceramic resonator and mounting comprising a ceramic resonator having electrodes on both flat major opposite surfaces thereof, and a pair of cover plates of elastoconductive material, each of which has an electric terminal and at least one contact means. Said resonator is supported between said contact means of said pair of cover members so as to be subjected to contact pressure by said contact means. An insulating spacer surrounds the periphery of said resonator and securely joins said pair of cover members to each other so as to form a housing around said resonator.

BY *Wenderoth, Lind & Ponack*
ATTORNEYS

PIEZOELECTRIC CERAMIC RESONATOR AND MOUNTING

This application is a continuation of Ser. No. 711,292, filed Mar. 21, 1968 and now abandoned.

BACKGROUND OF THE INVENTION

1. Field of the Invention

This invention relates to an improved ceramic resonator and a mounting therefor. In particular, it relates to a mounting device in which sealing covers act simultaneously as the resonator mounting and as electrical terminals.

Description of the Prior Art

A ceramic resonator is often mounted so as to be subjected to a resilient pressure caused by a pair of resilient plates and/or a pair of coil springs. Such a mounting is known in the prior art as a pressure mounting.

Such a prior art mounting system for the resonator does not have a sealing action. Therefore, the mounting system must be enclosed in a sealing capsule in order to increase the resistance of the resonator to the surrounding atmosphere and hence its reliability. At the same time, it is required that there be good electrical conduction between the electrical terminals and the electrodes of the resonator when it serves as a circuit component.

SUMMARY OF THE INVENTION

It is therefore, an object of the present invention to overcome these disadvantages and to provide a ceramic resonator and mounting in which parts of the mounting seal the unit and also act as the electrical terminals.

Another object of the present invention is to provide a ceramic resonator and mounting having a simplified mounting device and which is a low-cost ceramic resonator circuit component.

These objectives are achieved by providing a ceramic resonator and mounting resonating a ceramic resonator having electrodes on both flat surfaces thereof. A pair of cover member comprising elasto-conductive plates, each of which has an electrical terminal and at least one projecting point, sandwich the resonator between them and elastically contact the electrodes thereof. An insulating spacer surrounds the periphery of the resonator and securely connects the pair of cover members so as to form a housing for the resonator.

BRIEF DESCRIPTION OF THE DRAWINGS

Other objects and advantages will become apparent from the following description taken in connection with the drawings, wherein.

DESCRIPTION OF THE PREFERRED EMBODIMENT

Figure 1A:
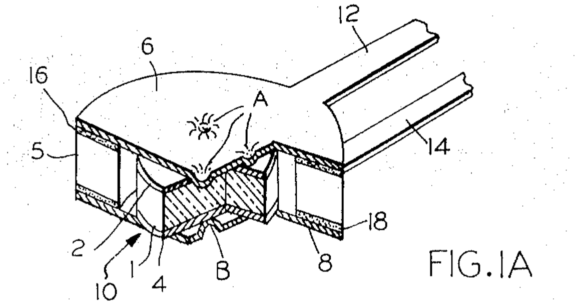
FIG. 1*a* is a perspective view, partly in section, showing a ceramic resonator mounting device according to the present invention.
Figure 1B:
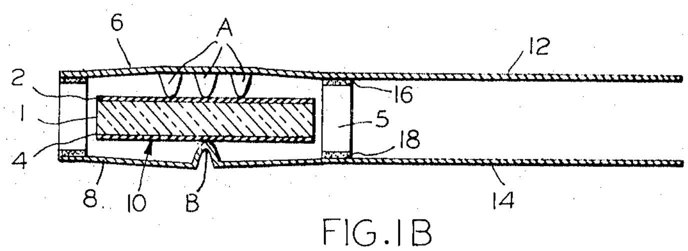
FIG. 1*b* is a sectional view showing the ceramic-resonator-mounting device on FIG. 1*a*.

Referring to FIG. 1, the mounting device comprises a ceramic resonator 10 which is supported by the projections A and B projecting toward each other from each of a pair of cover members 6 and 8 and which is surrounded by an insulating spacer 5. The insulating spacer 5 is securely connected to the cover members 6 and 8 by means of adhesive joints 16 and 18, as shown in FIG. 1. The ceramic resonator 10 is composed of a piezoelectric ceramic disc and/or plate 1 having electrodes 2 and 4 positioned over the entire flat major surfaces thereof. The resonator 10 has a resonance frequency which is dependent on its dimensions and is polarized to have a mode of vibration. The preferable mode of vibration for the present invention is a thickness mode for the resonator, such as a thickness-shear mode or a thickness-extension mode. The reason for this preference is that the mechanical displacements at the electrode surface of the thickness mode resonator are substantially uniform at a given operating frequency. Therefore, the frequency response of the resonator 10 is not dependent on the position of said projections A and B.

The mechanical displacements of the electrode surfaces of a resonator having another mode of vibrating such as, for example, a radial mode, are distributed from a nodal point to a circle on the electrode surfaces. Therefore, the frequency response would depend to a great extent on the position of said projections A and B. As a result, subresonant responses are liable to be produced which would cause signal distortion near the operating frequency of the electrical circuit in which the resonator is connected.

Referring again to FIG. 1, the insulating spacer 5 encloses the entire periphery of the resonator 10 and is adhered by adhesives 16 and 18, at the upper and lower edge surfaces thereof, respectively, to the upper cover member 6 and lower cover member 8, respectively, in such a way that the resonator 10 is completely enclosed. The pair of cover members 6 and 8, fixed to the insulating spacer 5, give to the projections A and B a resilient force perpendicular to the electrode surfaces of the resonator 10 thus causing the resonator to be supported between said projections A and B. Further, cover members 6 and 8 have extensions 12 and 14 serving as electrical terminals. The electrode 2 of the resonator is electrically connected to the electrical terminal 12 by means of its electrical contact with the projection A and the cover member 6. The electrode 4 is electrically connected to the electrical terminal 14 by means of its electrical contact with the projections B and the cover member 8.

It is clear from the above description, that the cover members 6 and 8 are required to have the characteristics of good electric conduction and good resiliency. A material such as brass, beryllium or a phosphor bronze is suitable for said cover members 6 and 8.

The insulating spacer 5 can be made of any insulating material such as a conventional plastic made from a phenol or a polycarbonate.

It is necessary that the resonator 10 be supported by a resilient pressure of from 30 gm./cm.$^2$ to 500 gm./cm.$^2$. A resilient pressure less than 30 gm./cm.$^2$ is too weak to support the resonator and causes an unstable frequency response when a mechanical shock is imparted to the mounting device. On the other hand, a resilient pressure above 500 gm./cm.$^2$ unduly suppresses the vibration of the resonator and prevents a desirable frequency response. The distance between the periphery of the resonator 10 and the inner surface of the insulating spacer 5 should be less than 1 mm. A distance of more than 1 mm. could possibly allow the resonator to move by more than 1 mm. within the housing when a mechanical shock is applied to the mounting device. Such movement is undesirable for a stable frequency response. For a stable frequency response, as described above, the length of the projections should also be less than 1 mm.

According to the present invention, it is necessary that the mechanical quality factor Q of the resonator should be less 1,000 at the operating vibration mode. The mounting device of the present invention is not applicable to a resonator having a mechanical quality factor Q greater than 1,000.

Figure 2:
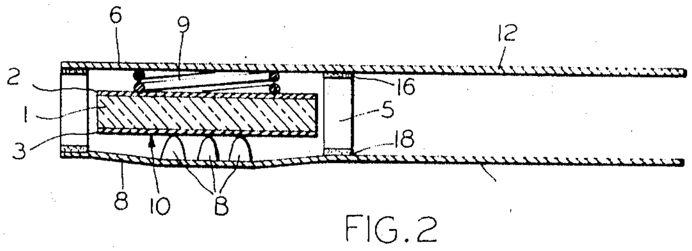
FIG. 2 is a sectional view showing a modified ceramic-resonator-mounting device according to the present invention.

FIG. 2 shows another embodiment of the present invention. Referring to FIG. 2, those characters which are the same as those shown in FIG. 1, refer to the same parts as in FIG. 1. The modification of FIG. 2 in the provision of a conductive coil spring 9 between the upper cover member 6 and the electrode 2 of the resonator 10 in place of projections A, so as to easily control the mounting pressure of the resonator 10.

Figure 3:
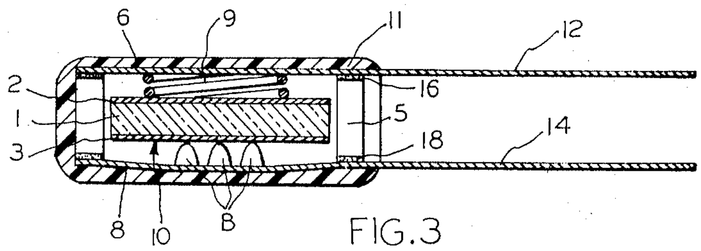
FIG. 3 is a sectional view showing another modified ceramic-resonator-mounting device according to the present invention.

Referring to FIG. 3, those characters which are the same as those of FIG. 1 and FIG. 2 refer to the same parts as in FIG. 1. The mounting device shown in FIG. 3 has the added feature of being molded into a covering 11 of an organic resin. The molded resin serves not only to assure the connection of the insulating spacer 5 with the pair of cover members 6 and 8, but also to improve the sealing qualities, the mechanical strength and the electrical insulation of the mounting device.

As described above, the mounting device of the present invention has many advantages, among them, the ease of manufacturing each part of the mounting unit by punching, a simple construction, miniaturization, flat packaging and a low cost.

As an example of an important application of the present invention, a mount device for a piezoelectric ceramic resonator which is used in a sound trap circuit of a TV receiver will be described below.

The piezoelectric ceramic resonator which traps a sound IF signal of 4.5 MHz. from a video signal in a TV receiver, can be constructed from a ceramic disc resonator vibrating in a thickness-shear mode of vibration, as described in U.S. Pat. application, Ser. No. 459,064, now pending. The resonator which is 4 mm. in diameter and 0.25 mm. in thickness is prepared by a per se well-known ceramic technique by using a commercially available piezoelectric ceramic material "PCM–18" (Electric Components Catalog: English Edition 1967 published on Apr. 10, 1967; Matsushita Electric Industrial Co., Ltd. Japan.)

An equivalent electric circuit of a ceramic resonator will be explained with reference to FIG. 4.

Figure 4:
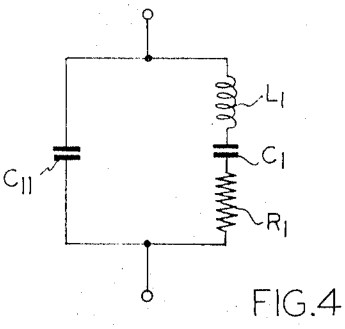
FIG. 4 is a conventional electrical equivalent circuit diagram of a ceramic resonator.

In FIG. 4 a series circuit of $L_1$, $C_1$, and $R_1$ represents a mechanical branch of a ceramic resonator and $C_{11}$ is the electrostatic capacitance between the electrodes. $L_1$, $C_1$, and $R_1$ are a motional inductance, a motional capacitance and a motional resistance, respectively. Using the equivalent circuit, the series resonance frequency $f_0$ is represented by an equation $f_0=½\pi\sqrt{L_1C_1}$ and the mechanical quality factor Q is represented by the equation $Q=2\pi f_0L_1/R_1$.

Referring to FIG. 4, the equivalent constants of the ceramic resonator resonating in the thickness-shear mode are shown in table 1.

Figure 5:
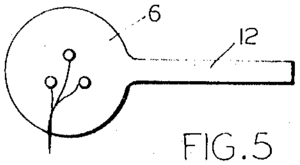
FIG. 5 is a plan view of a cover member element of the mounting device shown in FIGS. 1, 2, and 3.

The cover members 6 and 8 are made from brass discs 7 mm. in diameter and 0.1 in thickness and are provided with terminals 12 and 14, respectively which are 15 mm. in length and 1 mm. in width. The discs have, at the central part, 3 projections which are 0.5 mm. in height and which are positioned symmetrically, as shown in FIG. 5. Disc plates having the dimensions described above can easily be formed in a single step by punching it from a sheet of brass.

The insulating spacer 5 is made from a polycarbonate ring which has an outer diameter of 7 mm., an inner diameter of 4.5 mm. and a thickness of about 1 mm. An adhesive tape is applied to both end surfaces of the ring facing parallel to the axis of the ring. The adhesive tape is prepared by coating both sides of a plastic sheet with a pressure sensitive and/or a thermo-setting adhesive material and covering the sheet with a peelable paper. Such tapes are commercially available, for instance, SCOTCH No. 75 manufactured by Minnesota Mining and Manufacturing Co. and No. 511 manufactured by Nitto Denki-Kogyo KK. The spacer ring having the adhesive tape attached to the flat surfaces thereof is made by the following process. The first step comprises applying the adhesive tapes to both surfaces of a polycarbonate sheet having a thickness of 1 mm. The ring is then punched out from the sheet by a conventional punching technique.

The piezoelectric ceramic resonator is easily mounted in the mounting device comprising cover members 6 and 8 and the insulating spacer 5, as shown in FIG. 1. According to this mounting method, the ceramic resonator is subject to a resilient pressure of about 200 gm./cm.$^2$.

The resilient pressure of the mounting device can preferably be set by using the structure shown in FIG. 2. In this case, the coil spring is a phospher bronze spring 2.5 mm. in diameter and having a pitch of 1.4 mm. and having three turns. The coil spring can be plated with gold by a conventional chemical plating process.

It is more advantageous that the mounting device shown in FIGS. 1 and 2 be embedded in an organic resin with the electrical terminals 12 and 14 extending from the organic resin. In this case, the mounting device is preheated to a temperature of from 100° to 170° C. Then the preheated device is put in a powder of a conventional organic epoxy resin so as to be covered by heat-cured organic epoxy resin. An example of a satisfactory organic epoxy resin is SCOTCH No. 263 manufactured by the Minnesota Mining and Manufacturing Co. The organic epoxy resin covering on the mounting device increases the strength of the connection between the insulating spacer and the cover members and also improves the sealing effect. Furthermore, when the covered mounting device is assembled in a TV circuit, the electrical insulation from other circuit components is greatly improved.

Table 2 shows the equivalent constants of a mounted resonator. Comparing table 2 with table 1, which shows the equivalent constants of the resonator prior to mounting, it will be understood that the deviation of the resonance frequency is about 0.1 percent and that the increase in the resonance impedance is 0.3 ohms. The increase in the resonance frequency is due to an increase in the stiffness of the spring action of the mounting. Considering the stiffness of the spring action, it is possible to design the device so as to obtain a preselected resonance frequency. The loss of elasticity due to mounting is from 0.1 to 1.0 ohms in the frequency range from 1 to 20 MHz., and the quality factor Q is still more than 400 even after mounting, as shown in table 2. The value of the quality factor which is used for an IF circuit of a conventional TV receiver or for a conventional radio receiver ranges from 50 to 1000. Therefore, the elastic loss attributable to the mounting device of the present invention can practically be neglected.

From the illustrative description and drawings of the preferred embodiments chosen as exemplary of the application of the principles of both the method and apparatus aspects of the present invention, it will be clear to those skilled in the art that certain minor modifications and variations may be employed without departing from the essence and true spirit of the invention. Accordingly, it is to be understood that the invention should be deemed limited only by the fair scope of the claims that follow and equivalents thereto.

TABLE 1

| $f_0$ (mHz.) | $C_{11}$ (pf.) | $L_1$ (μh.) | $C_1$ (pf.) | $R_1$ (Ω) | Q |
|---|---|---|---|---|---|
| 4.5089 | 387 | 18 | 68 | 1.0 | 521 |

TABLE 2

| $f_0$ (mHz.) | $C_{11}$ (pf.) | $L_1$ (μh.) | $C_1$ (pf.) | $R_1$ (Ω) | Q |
|---|---|---|---|---|---|
| 4.5133 | 386 | 19 | 65 | 1.3 | 414 |

We claim:

1. A ceramic resonator and mounting therefor comprising a ceramic resonator having opposite flat major surfaces, electrodes applied to both said surfaces, a pair of cover members of elasto-conductive material, each of which has an electric terminal and has at least one electrically conductive projection projecting toward the other cover member, said resonator being supported between said projections projecting from said pair of cover members with the projections in electrical contact with said electrodes, and said resonator being under a contact pressure of from 30 to 500 gm./cm.$^2$ through said projections, and an insulating spacer surrounding the periphery of said resonator and being spaced less than 1 mm. from said periphery and attached securely between the peripheral edges of said pair of cover members around the entire periphery thereof, said cover member and said insulating spacer forming a completely closed housing having said resonator sealed therein.

2. A ceramic resonator and mounting as claimed in claim 1, wherein said pair of cover members are adhered to said insulating spacer by an adhesive backed plastic tape.

3. A ceramic resonator and mounting as claimed in claim 1, wherein said housing is embedded in an organic resin with said electric terminals extending from said organic resin.

4. A ceramic resonator and mounting as claimed in claim 1, wherein said ceramic resonator vibrates in the thickness-shear mode at an operating frequency.

5. A ceramic resonator and mounting as claimed in claim 1, wherein said ceramic resonator vibrates in the thickness-extension mode at an operating frequency.

* * * * *